US010202854B2

(12) United States Patent
Uskert et al.

(10) Patent No.: US 10,202,854 B2
(45) Date of Patent: Feb. 12, 2019

(54) ABRASIVE TIPS FOR CERAMIC MATRIX COMPOSITE BLADES AND METHODS FOR MAKING THE SAME

(71) Applicants: Rolls-Royce Corporation, Indianapolis, IN (US); Rolls-Royce North American Technologies, Inc., Indianapolis, IN (US)

(72) Inventors: Richard C. Uskert, Timonium, MD (US); Kang N. Lee, Zionsville, IN (US); Ted J. Freeman, Danville, IN (US)

(73) Assignees: Rolls-Royce North America Technologies, Inc., Indianapolis, IN (US); Rolls-Royce Corporation, Indianapolis, IN (US)

( * ) Notice: Subject to any disclaimer, the term of this patent is extended or adjusted under 35 U.S.C. 154(b) by 360 days.

(21) Appl. No.: 14/957,149

(22) Filed: Dec. 2, 2015

(65) Prior Publication Data
US 2016/0177745 A1    Jun. 23, 2016

Related U.S. Application Data

(60) Provisional application No. 62/093,605, filed on Dec. 18, 2014.

(51) Int. Cl.
| | | |
|---|---|---|
| C23C 16/00 | (2006.01) |
| F01D 5/28 | (2006.01) |
| F01D 5/18 | (2006.01) |
| C23C 16/04 | (2006.01) |
| F01D 5/14 | (2006.01) |
| F01D 11/12 | (2006.01) |

(52) U.S. Cl.
CPC ............ *F01D 5/284* (2013.01); *C23C 16/045* (2013.01); *F01D 5/14* (2013.01); *F01D 5/147* (2013.01); *F01D 5/18* (2013.01); *F01D 5/282* (2013.01); *F01D 5/288* (2013.01); *F01D 11/12* (2013.01); *F05D 2220/32* (2013.01); *F05D 2230/314* (2013.01); *F05D 2240/307* (2013.01); *F05D 2260/20* (2013.01); *F05D 2300/2261* (2013.01); *F05D 2300/2282* (2013.01); *F05D 2300/2283* (2013.01); *F05D 2300/43* (2013.01); *F05D 2300/6033* (2013.01)

(58) Field of Classification Search
CPC .................................................... C23C 16/045
See application file for complete search history.

(56) References Cited

U.S. PATENT DOCUMENTS

| | | | |
|---|---|---|---|
| 4,247,259 | A | 1/1981 | Saboe et al. |
| 4,802,828 | A | 2/1989 | Rutz et al. |
| 4,854,196 | A | 8/1989 | Mehan |
| 5,264,011 | A | 11/1993 | Brown et al. |
| 5,359,770 | A | 11/1994 | Brown et al. |
| 7,419,363 | B2 | 9/2008 | Downs |

(Continued)

*Primary Examiner* — Robert A Vetere
(74) *Attorney, Agent, or Firm* — Shumaker & Sieffert, P.A.

(57) ABSTRACT

A blade and method for producing the blade for a gas turbine engine are described herein. The blade may include a composite airfoil. The airfoil may comprise a ceramic material, and a distal end. A tip may extend from the distal end of the airfoil. The tip of the airfoil may comprise a substantially porous structure and may comprise infiltrated material extending from an airfoil preform to a tip preform to join the airfoil preform and the tip preform.

14 Claims, 2 Drawing Sheets

(56) References Cited

U.S. PATENT DOCUMENTS

| | | | |
|---|---|---|---|
| 7,510,778 B2 | 3/2009 | Bernard et al. | |
| 7,556,477 B2 | 7/2009 | Sherlock et al. | |
| 7,736,130 B2 | 6/2010 | Schilling et al. | |
| 2007/0258811 A1* | 11/2007 | Shi | F01D 5/147 415/210.1 |
| 2009/0202355 A1* | 8/2009 | Dierksmeier | F01D 5/225 416/226 |
| 2010/0050435 A1* | 3/2010 | Ahmad Zainuddin | B23P 6/005 29/889.1 |
| 2013/0022471 A1* | 1/2013 | Roberts, III | F01D 5/005 416/229 R |
| 2013/0251939 A1* | 9/2013 | Kleinow | B32B 18/00 428/121 |
| 2014/0050893 A1* | 2/2014 | Paige | F01D 5/28 428/158 |

* cited by examiner

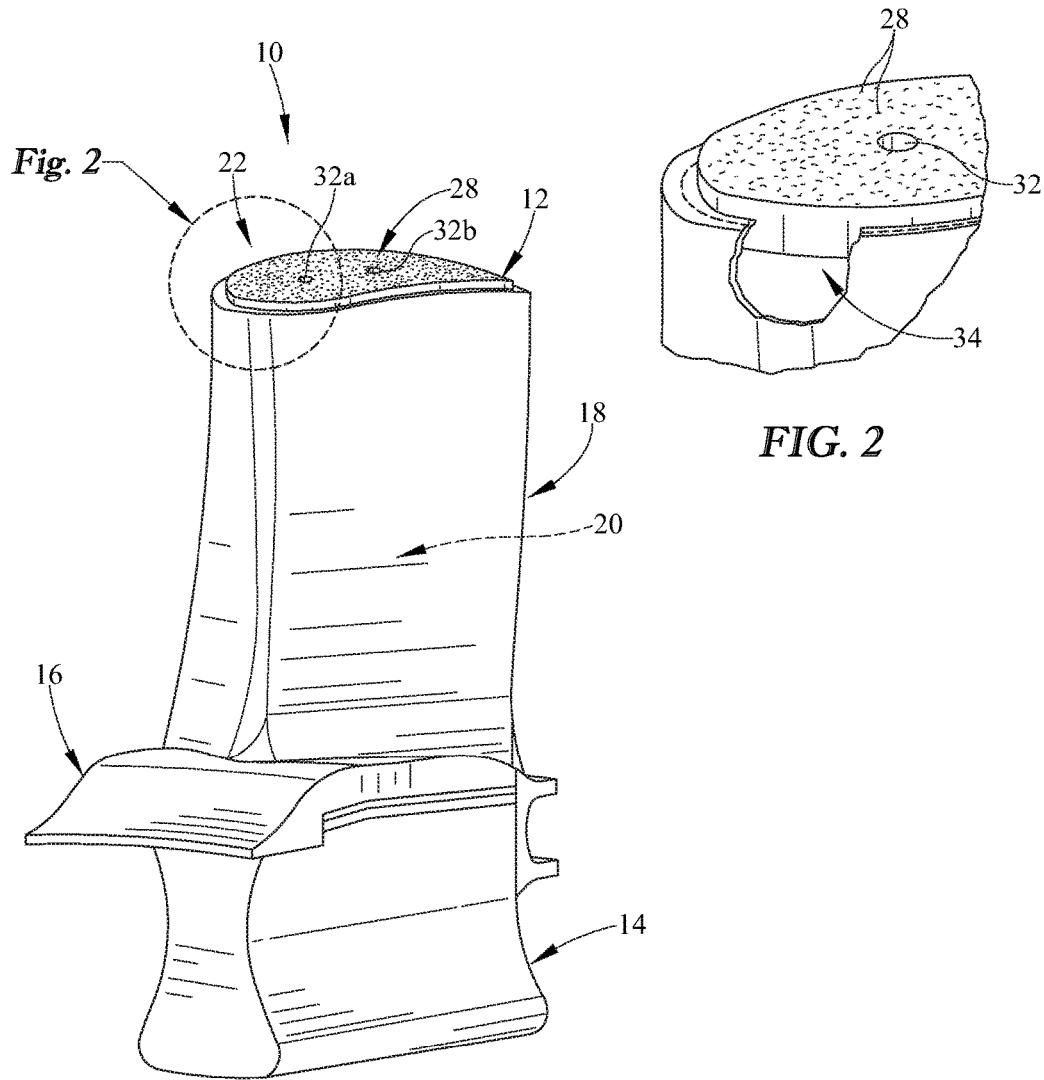
*Fig. 2*
FIG. 1
FIG. 2
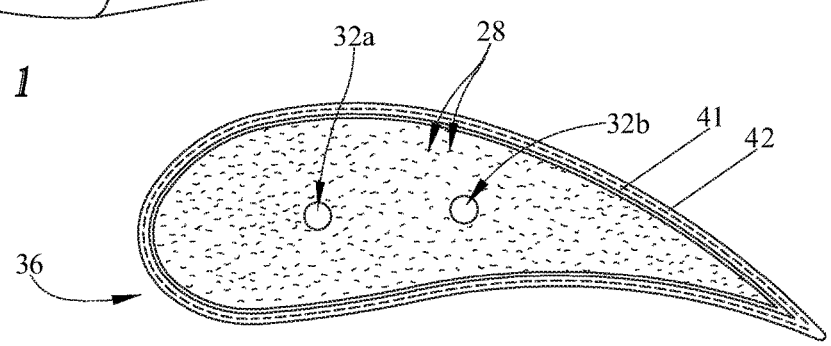
FIG. 3

ABRASIVE TIPS FOR CERAMIC MATRIX COMPOSITE BLADES AND METHODS FOR MAKING THE SAME

CROSS REFERENCE TO RELATED APPLICATIONS

This application claims priority to and the benefit of U.S. Provisional Patent Application Number 62/093605, filed 18 Dec. 2014, the disclosure of which is now expressly incorporated herein by reference.

FIELD OF THE DISCLOSURE

The present disclosure relates generally to gas turbine engines, and more specifically to ceramic matrix composite components used in gas turbine engines.

BACKGROUND

Gas turbine engine components are exposed to high temperature environments with an increasing demand for even higher temperatures. Economic and environmental concerns relating to the reduction of emissions and the increase of efficiency are driving the demand for higher gas turbine operating temperatures. In order to meet these demands, the designs of components, such as turbine blades, are incorporating ceramic-containing materials like ceramic matrix composites.

Sometimes turbine blades include abrasive tips which may be designed to wear away an abradable blade track in a controlled manner. The abradable coating may be worn away during interaction between the rotating blades and stationary parts of an engine. Traditionally turbine blade tips may include a metallic alloy. Abrasive tips may be embedded with a particle. Bonding of the turbine blade tip to a compatible superalloy blade may require a layer of nickel. Because of the demand for higher temperatures, ceramic matrix composite components may replace traditional metallic components, such as turbine blades. One benefit of ceramic matrix composite engine components is the high-temperature mechanical, physical, and chemical properties of the ceramic matrix composite components which may allow the gas turbine engines to operate at higher temperatures than current engines. However, traditional blade tips and coatings may be incompatible with a ceramic matrix composite blade because of bonding, joining, and manufacturing difficulties. Additionally, there may be thermal-mechanical stresses induced between the traditional coating and the ceramic matrix composite component during operation of a gas turbine engine.

SUMMARY

The present disclosure may comprise one or more of the following features and combinations thereof.

According to an aspect of the present disclosure, a method for making a blade for use in a gas turbine engine is taught. The method may include forming a tip preform having a continuous porosity substantially throughout the tip preform, positioning the tip preform relative to an airfoil preform so that the tip preform may extend from a distal end of the airfoil preform, and co-infiltrating, after the positioning the tip preform, the tip preform and the airfoil preform to densify the tip preform and the airfoil preform thereby joining the tip preform and the airfoil preform to form the blade. The airfoil preform may include ceramic material and may have continuous porosity substantially throughout the airfoil preform.

In some embodiments, co- co-infiltrating may comprise densifying the tip preform and the airfoil preform via slurry infiltration and melt infiltration. Co-infiltrating may further comprise densifying the tip preform and the airfoil preform via chemical vapor infiltration or chemical vapor deposition prior to slurry infiltration and melt infiltration.

In some embodiments, positioning the tip preform relative to the airfoil preform may comprise inserting the tip preform into a tip-receiving space that may extend into the airfoil preform from the distal end of the airfoil preform. The infiltrated material may extend from the airfoil preform to the tip preform.

In some embodiments, forming the tip preform may comprise mixing tip particles with a substrate of the tip preform. The tip particles may comprise silicon carbide. The tip particles may comprise cubic boron nitride, silicon nitride or combination thereof. Forming the tip preform may comprise encapsulating the tip particles and the substrate in a polymer.

In some embodiments, co-infiltrating the substrate of the tip preform and the airfoil preform may include burning off the polymer. In some embodiments, the airfoil preform may be substantially silicon carbide based fibers.

According to another aspect of the present disclosure a blade for use in a gas turbine engine is taught. The blade may comprise an airfoil comprising a ceramic material, a tip comprising a porous structure, extending beyond a distal end of the airfoil, and infiltrated material that may extend from the airfoil to the tip to join the airfoil and the tip. It is understood and appreciated that the airfoil may be a composite and the airfoil and tip may be preforms.

In some embodiments, the infiltrated material of the airfoil may be substantially identical to the infiltrated material of the tip. In some embodiments, the ceramic material of the airfoil may comprise silicon carbide, and the tip may comprise silicon carbide. The airfoil may include a tip-receiving space that extends into the airfoil and a portion of the tip may be arranged in the tip-receiving space of the airfoil. The airfoil may include a hollow core in fluid communication with the tip-receiving space.

In some embodiments, the tip may further comprise tip particles suspended in a substrate. The tip particles may include silicon carbide. The tip particles may be selected from cubic boron nitride, silicon nitride, or a combination thereof.

In some embodiments, the porosity of the tip may be between about 1 percent and about 10 percent by volume. The tip may have a shape that generally conforms to the shape of the airfoil when viewed from beyond the distal end of the airfoil.

In some embodiments, the blade may be formed by one of chemical vapor infiltration; a combination of chemical vapor infiltration, melt infiltration, and/or polymer-infiltration-pyrolysis; or a combination of chemical vapor infiltration and/or polymer-infiltration-pyrolysis.

These and other features of the present disclosure will become more apparent from the following description of the illustrative embodiments

BRIEF DESCRIPTION OF THE DRAWINGS

FIG. 1 is perspective view of a blade made from ceramic matrix materials and adapted for use in a gas turbine engine showing that the blade includes a root, a platform, a composite airfoil, and an abrasive tip;

FIG. 2 is an enlarged view of the blade from FIG. 1 depicting the tip extending beyond the distal end of the of the airfoil;

FIG. 3. is top plan view of the blade from FIGS. 1 and 2 depicting a shape of the tip that generally conforms to the shape of the airfoil of the blade.

DETAILED DESCRIPTION OF THE DRAWINGS

Figure 4:
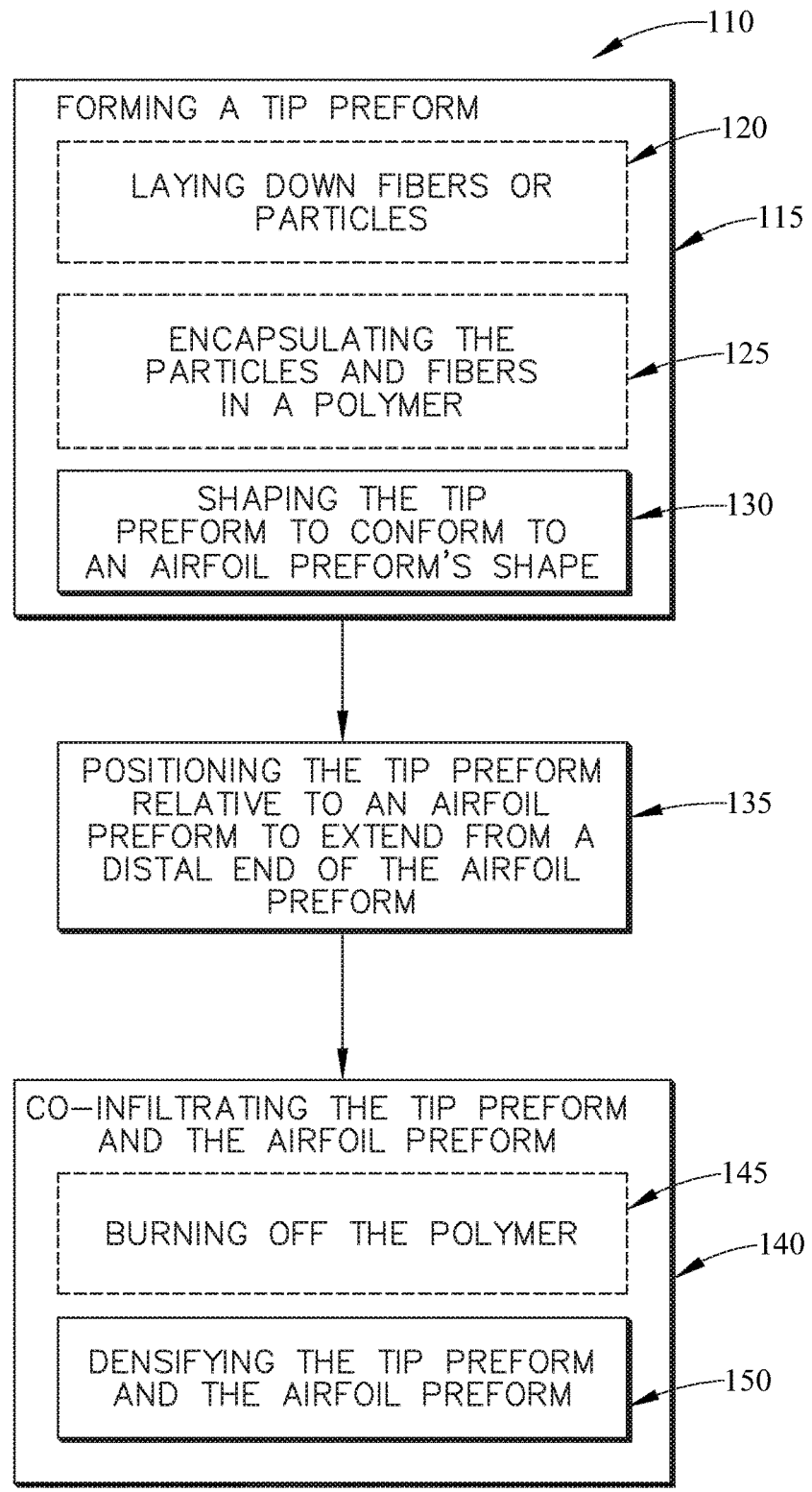
FIG. 4 is block diagram of a method for producing the blade shown in FIGS. 1-3.

For the purposes of promoting an understanding of the principles of the disclosure, reference will now be made to a number of illustrative embodiments illustrated in the drawings and specific language will be used to describe the same.

An illustrative blade 10 adapted for use in a gas turbine engine includes a tip 12, as shown in FIG. 1. The tip 12 may be abrasive and may be designed to interact with a blade track having an abradable coating that surrounds the blade track such that the abrasive tip 12 rubs the abradable coating under some operating conditions of the engine. The blade 10 may also include a root 14, a platform 16 coupled to the root 14, and an airfoil 18 coupled to the platform 16. The blade 10, the platform 16 and the root 14 may be single piece construction or may be separate components joined together. The platform 16 may be sandwiched between the root 14 and the airfoil 18 and may separate the root 14 from the airfoil 18 so that gasses passing over the airfoil 18 are blocked from moving down around the root 14, as suggested in FIG. 1. The airfoil 18 may be shaped aerodynamically to interact with gases moving over the blade 10.

As shown in FIG. 2, the tip 12 may be adapted to extend into a tip receiving space 34 of the airfoil 18 and may extend out of the tip receiving space 34 of the airfoil 18. The tip 12 may provide an abrasive surface including particles 28 designed to wear away an abradable in a controlled manner during interaction between the rotating blade 10 and stationary parts of an engine (e.g. a blade track). The thickness of the tip 12 may vary based on distance between the rotating component and the static components such that the abradable may be worn away during use without damage to the airfoil 18.

The tip 12 may include a material substantially identical to a material used in the airfoil 18, such as a ceramic material. The tip 12 may include at least one material dissimilar to materials in the airfoil 18. In some examples, the tip 12 may include particles such as silicon carbide. In other examples, the tip 12 may include particles dissimilar from the materials of the airfoil 18. The dissimilar particles may include cubic boron nitride, silicon nitride, or a combination thereof.

As shown in FIG. 3, the shape of the tip 36 may generally conform to the shape of the airfoil 18 when viewed from beyond the distal end 22 of the airfoil 18. Illustratively, the tip 12 may have a porosity of between about 1 percent and about 10 percent by volume. The porosity may be a measure of the void or empty spaces in a material, and is a fraction of the volume of voids over the total volume.

The tip 12 may be formed from a tip preform. The tip preform may have continuous porosity substantially throughout the tip preform. Continuous porosity may allow a gas or liquid phase to infiltrate into the pores during infiltration steps. Continuous porosity may be a permeable structure with open cells for infiltrating materials. The tip preform may be a layer of particles, fibers, or combination thereof such as ceramic particles or ceramic fibers. The fibers may be formed into a weave. The weave may then be stacked to form the preform shape. In some embodiments, the tip preform may include a ceramic foam. The tip preform may include a ceramic foam adjacent to a layer of particles or fibers. The ceramic foam may be sandwiched between the layer of particles or fibers and the airfoil 10 when the blade 10 is assembled. The tip preform may have a porosity of between about 10% and about 90% by volume such that it may be infiltrated in subsequent densification steps.

As shown in FIGS. 1 and 2, in the illustrative embodiment, the airfoil 18 of the blade 10, may include a ceramic matrix material and may include ceramic-containing reinforcements. For example, the airfoil may include a plurality of fibers woven into a ply (sometimes called a weave), and the plies 41, 42 may be laid up or stacked on top of each other to form the airfoil 18. The plies 41, 42 may form a tip-receiving space 34 at a distal end 22 of the airfoil 18 and a core 20, as shown in FIGS. 1 and 2. The tip-receiving space 34 may extend into the airfoil 18 and a portion of the tip 12 may be arranged in the tip receiving space 34 of the airfoil 18.

The core 20 may be in fluid communication with the tip receiving space 34 of the airfoil 18. The core may be hollow. The core 20 may also allow flow of cooling air and may be in communication with cooling holes 32a, 32b formed in the tip 12 to transport cooling air through the airfoil 18 and thereby maintain the temperature of airfoil 18. In some embodiments, ribs or other support structures may extend through the core 20.

The airfoil 18 may be formed from an airfoil preform. The airfoil preform may be fabricated from a preform of ceramic fibers to form plies. The ceramic fibers may be fibers comprising silicon carbide. The airfoil preform may have porosity between the fibers that may be infiltrated by an infiltrated material such as silicon metal, silicon carbide, and/or boron nitride during co-infiltration steps described herein. The porosity of the airfoil preform may be between about 10% and about 90% by volume.

The tip preform and the airfoil preform may be infiltrated by an infiltrate material such that a continuous blade 10 is formed. The continuous blade 10 may be such that there is no stopping point, breaking point, or interruption between the airfoil 18 and the tip 12. Thus, the continuous blade 10 may be a monolithic piece or single piece construction. The infiltrated material may include silicon carbide and/or boron nitride. The infiltrated material may extend from the airfoil preform to the tip preform joining the tip preform to the airfoil preform. For example, the infiltrated material may extend from within the airfoil preform to within the tip preform. The infiltrated material may be substantially the same within the airfoil preform and the tip preform such that a similar or substantially the same matrix material is formed to join the tip 12 and the airfoil 18.

One illustrative method 110 for making a blade, such as the blade 10 for use in a gas turbine engine described herein, is shown in FIG. 4. The method described herein is for making a blade, but it is understood any rotating component with an abrasive surface in contact with an abradable surface of a static component may be formed by the method described herein. In a step 115 of the method of 110, a tip preform having continuous porosity substantially throughout the tip preform is formed. The step 115 of forming a tip preform may include sub-step 120 of laying fibers, foam, or particles, sub-step 125 of encapsulating the fibers, foam or particles of the tip preform in a polymer, and sub-step 130 of shaping the tip preform to conform to a shape of an airfoil preform. The tip preform may have continuous porosity and may form a structural scaffold for subsequent infiltration of a ceramic matrix. The sub-steps 120, 125, 130 for forming a tip preform may be completed in any order and not all sub-steps need to be used in all instances of forming a tip preform for use in a gas turbine engine.

In sub-step 120 of the step 115, the particles may be suspended in a substrate or material comprising chopped fibers, continuous fibers, woven fabrics, and/or ceramic foam. Combinations thereof may be laid-up, fixed and shaped into the configuration of a desired component. The particles used to form the tip preform may be similar to materials used in the airfoil preform and may include silicon carbide. In other embodiments, the particle used to form the tip perform may be dissimilar to the materials used in the airfoil preform and may include cubic boron nitride, silicon nitride, or a combination thereof.

In some embodiments, after forming a layer of particles, other materials or particles may be added to a layer of porous material. In some embodiments, the porous material may be a reticulated foam, including but not limited to a ceramic foam such as a silicon carbide foam. A reticulated foam may provide a porous substrate or structure which may be constructed, arranged, or marked like a net or network. A reticulated foam may have a pattern of interlacing lines. The particles may be cast into the foam or porous substrate to form the tip perform. The porous substrate may be infiltrated by particles in subsequent steps.

In optional sub-step 125 of the step 115, the particles, fibers, and/or foam are encapsulated in a polymer, as shown in FIG. 4. The polymer may be one of polyesters poly (ethylene terephthalate), polyimide, polycarbonate, high-density polyethylene (HDPE), polyvinylidene fluoride, and polyvinyl chloride (PVC). The polymer may be used when the tip particles of the tip preform are dissimilar to the particles of airfoil preform such that the two may not bind. The polymer may encapsulate the dissimilar particles of the tip 12 to hold the particles in position allowing the infiltrated materials to bind the tip preform and the airfoil preform. For example, the dissimilar particles may include cubic boron nitride or silicon nitride. The polymer may encapsulate or surround the particle and the porous substrate to provide a shape for use in sub-step 130 of the method 100.

In sub-step 130 of the step 115, the tip particles, fibers, or/and foam are shaped to conform to the shape of the airfoil preform, as shown in FIG. 4. The tip preform may be machined to the shape of the airfoil shown in FIG. 3. In some embodiments, the tip preform may be machined prior to an initial co-infiltrating step including densification via chemical vapor deposition (CVD) or chemical vapor infiltration (CVI). In other embodiments, the tip preform may be machined after an initial infiltrating step including densification via CVD or CVI.

In step 135 of the method 110, the tip preform is positioned relative to an airfoil preform. The tip preform may be inserted into a tip receiving space, such as the tip receiving space 34 shown in FIG. 2. The tip receiving space may be at the distal end 22 of the airfoil 18. The tip preform may be positioned to extend from inside the tip receiving space to beyond the distal end 22 of the airfoil 18.

In step 140 of the method 110, co-infiltrating of the tip preform and the airfoil preform is performed, as shown in FIG. 4. Co-infiltrating may include an optional sub-step 145 of burning off a polymer, and a sub-step 150 of densifying the tip preform and the airfoil preform to fix the tip to the airfoil. The sub-steps of co-infiltrating may be completed in any order and not all steps need to be used in all instances of co-infiltrating the tip preform and the airfoil preform for use in a gas turbine engine.

In sub-step 145 of the step 140, the polymer optionally included in the tip preform may be burned off, as shown in FIG. 4. The polymer may only be burned off if a polymer was added in step 125 of method 110. Burning off the polymer may be performed by exposing the tip preform to heat within a furnace. In some embodiments, burning off the polymer may occur simultaneously with the sub-step 150 of densifying the tip preform and the airfoil preform. In some embodiments, the polymer included in the tip preform may be burned off during an independent operation.

In sub-step 150 of the step 140, co-infiltrating includes densifying the tip preform and the airfoil preform. Densifying the tip preform and the airfoil preform may include CVD or CVI, slurry infiltration, and/or melt infiltration. In some embodiments, the tip preform may be added to the airfoil preform prior to the airfoil preform undergoing CVD or CVI. In other embodiments, the tip preform may be added to the airfoil preform after the airfoil preform undergoes infiltrating via CVD or CVI.

CVD or CVI may be used to build up one or more layers on the ceramic fibers of the airfoil preform and the tip particle. The one or more layers may include a silicon carbide layer. Furthermore, an intermediate layers such as boron nitride may be deposited prior to the silicon carbide layer. CVD may follow the same thermodynamics and chemistry. CVI and CVD may be non-line of sight processes such that CVI and CVD may occur completely within a furnace. The starting material for CVI may include a gaseous precursor controlled by quartz tubes and may be performed at temperatures between about 900° C. and about 1300° C. CVI may be performed at relatively low pressure and may use multiple cycles in the furnace. Silicon carbide may also be deposited to build up one or more layers on the fibers while the preform is in the furnace. The silicon carbide may provide additional protection to the fibers and may also increase the stiffness of the airfoil preform fibers and the tip preform. In some embodiments, boron nitride may be deposited prior the silicon carbide to provide further beneficial mechanical properties to the fibers. The preform may be taken out of the furnace after a first pass through the furnace and weighed. If the preform is not at the target weight it may go through the furnace for another run, which may occur as many times as necessary in order to achieve the target weight. The target weight may be determined by the final part to be made. CVI or CVD may form a preform with a porosity of between about 40% and about 50%. If the preform is at the target weight the part may undergo slurry infiltration.

Once the tip preform and airfoil preform fibers are coated via CVI or CVD, additional particles may be infiltrated into the preforms concurrently via other infiltration methods. For example, a slurry infiltration process may include infiltrating the preforms with slurry. Dispersing the slurry throughout the preforms may include immersing the preforms in the slurry composition. The slurry may include particles of carbon and optionally silicon carbide. The slurry may flow into the spaces, pores, or openings between the fibers of the preforms such that the slurry particles may uniformly impregnate the pores of the preform and reside in the interstices between the preform fibers. The slurry infiltration process may form a preform with a porosity of between about 35% and about 45%.

Prior to immersion, the preform fibers may optionally be prepared for slurry infiltration by exposing the fibers to a solution including, for example, water, solvents, surfactants and the like to aid impregnation of the fibers. Optionally, a vacuum may be drawn prior to slurry introduction to purge gas from the preforms and further enhance impregnation. Slurry infiltration may be conducted at any suitable temperature such as at room temperature (about 20° C. to about 35° C.). The slurry infiltration may be enhanced by application of external pressure after slurry introduction such as at one atmosphere pressure gradient.

After slurry infiltration, the tip preform and airfoil preform may undergo melt infiltration. During melt infiltration a molten metal or alloy may wick between the openings of the preforms. In various embodiments, the molten metal or alloy may have composition that includes silicon, boron, aluminum, yttrium, titanium, zirconium, oxides thereof, and mixtures and combinations thereof. In some instances, graphite powder may be added to assist the melt infiltration. The molten metal or alloy may wick into the remaining pores of the preform through capillary pressure. For example, molten silicon metal may wick into the pores and form silicon carbide to create a matrix between the fibers resulting in a relatively dense tip 12 and airfoil 18 compared to the preforms. For example, after the preforms have been densified, the airfoil 18 and the tip 12 may have a porosity of between about 1 percent and about 10 percent by volume. In one example, a temperature for infiltration of silicon may be between about 1400° C. and about 1500° C. The duration of the infiltration may be between about 15 minutes and 4 hours. The infiltration process may optionally be carried out under vacuum, but in other embodiments melt infiltration may be carried out with an inert gas under atmospheric pressure to limit evaporation losses. The co-infiltration processes described herein may create a tip joined to an airfoil such that the tip 12 and the airfoil 18 are a continuous structure.

In some examples the airfoil preform for blade 10 may formed by chemical vapor infiltration. In other examples, the airfoil preform may be formed by a combination of chemical vapor infiltration, melt infiltration, polymer-infiltration-pyrolysis. In other examples, the airfoil preform may be formed by a combination of chemical vapor infiltration and polymer-infiltration-pyrolysis.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A method of making a blade for a gas turbine engine, the method comprising
    forming a tip preform having continuous porosity substantially throughout the tip preform,
    positioning the tip preform relative to an airfoil preform so that the tip preform extends beyond a distal end of the airfoil preform, the airfoil preform including ceramic material and having continuous porosity substantially throughout the airfoil preform, and
    co-infiltrating, after the positioning the tip preform, the tip preform and the airfoil preform to densify the tip preform and the airfoil preform thereby joining the tip preform and the airfoil preform to form the blade.

2. The method of claim 1, wherein the co-infiltrating comprises densifying the tip preform and the airfoil preform via slurry infiltration and melt infiltration.

3. The method of claim 2, wherein the co-infiltrating further comprises densifying the tip preform and the airfoil preform via chemical vapor infiltration or chemical vapor deposition prior to slurry infiltration and melt infiltration.

4. The method of claim 1, wherein the positioning the tip preform relative to the airfoil preform comprises inserting the tip preform into a tip-receiving space that extends into the airfoil preform from the distal end of the airfoil preform.

5. The method of claim 1, wherein an infiltrated material extends from the airfoil preform to the tip preform.

6. The method of claim 1, wherein the forming the tip preform comprises mixing tip particles with a substrate of the tip preform, and wherein, after co-infiltrating the tip preform and the airfoil preform, the tip preform defines an abrasive surface of an abrasive tip of the blade.

7. The method of claim 6, wherein the tip particles comprise silicon carbide.

8. The method of claim 6, wherein the tip particles comprise cubic boron nitride, silicon nitride or a combination thereof, and the forming the tip preform comprises encapsulating the tip particles and the substrate in a polymer.

9. The method of claim 8, wherein the co-infiltrating the substrate of the tip preform and the airfoil preform includes burning off the polymer.

10. The method of claim 1, wherein the airfoil preform is substantially silicon carbide based fibers.

11. The method of claim 1, further comprising positioning the blade adjacent to an abradable coating such that the tip rubs the abradable coating under some operating conditions of the gas turbine engine.

12. A method comprising:
    forming a tip preform having continuous porosity substantially throughout the tip preform by at least:
        suspending tip particles in a substrate or material comprising at least one of chopped fibers, continuous fibers, woven fabrics, or ceramic foam;
    positioning the tip preform relative to an airfoil preform so that the tip preform extends beyond a distal end of the airfoil preform, the airfoil preform including ceramic material and having continuous porosity substantially throughout the airfoil preform, and
    co-infiltrating, after the positioning the tip preform, the tip preform and the airfoil preform to densify the tip preform and the airfoil preform thereby joining the tip preform and the airfoil preform to form the blade, wherein the infiltrated tip preform defines a distal-most surface of the blade, and wherein the distal-most surface of the blade comprises the tip particles.

13. The method of claim 12, further comprising positioning the blade adjacent to an abradable coating such that the tip rubs the abradable coating under some operating conditions of the gas turbine engine.

14. The method of claim 12, wherein positioning the tip preform relative to the airfoil preform comprises inserting the tip preform into a tip-receiving space that extends into the airfoil preform from the distal end of the airfoil preform, wherein the tip preform extends from inside the tip receiving space to beyond the distal end of the airfoil.

* * * * *